United States Patent [19]
Foo

[11] Patent Number: 6,078,175
[45] Date of Patent: Jun. 20, 2000

[54] ACQUISTION OF SEGMENTED CARDIAC GATED MRI PERFUSION IMAGES

[75] Inventor: Thomas K F Foo, Rockville, Md.

[73] Assignee: General Electric Company, Milwaukee, Wis.

[21] Appl. No.: 09/179,000

[22] Filed: Oct. 26, 1998

[51] Int. Cl.[7] ........................................... G01V 3/00
[52] U.S. Cl. .................. 324/306; 324/300; 324/309; 128/653
[58] Field of Search ................................ 324/306, 309, 324/300, 318

[56] References Cited

U.S. PATENT DOCUMENTS 5,713,359   2/1998   Dumoulin et al. ................... 128/653.2

*Primary Examiner*—Christine K. Oda
*Assistant Examiner*—Brij Shrivastav
*Attorney, Agent, or Firm*—Quarles & Brady; Christian G. Cabou

[57] ABSTRACT

NMR data for imaging perfusion of blood is acquired from a series of slice locations using a cardiac gated NMR pulse sequence. Data for the slice locations are acquired by a corresponding series of data acquisition segments performed during the R—R interval of each cardiac cycle. Selective rf saturation pulses are interleaved with the data acquisition segments to uniformly condition spin magnetization in each slice location.

11 Claims, 3 Drawing Sheets

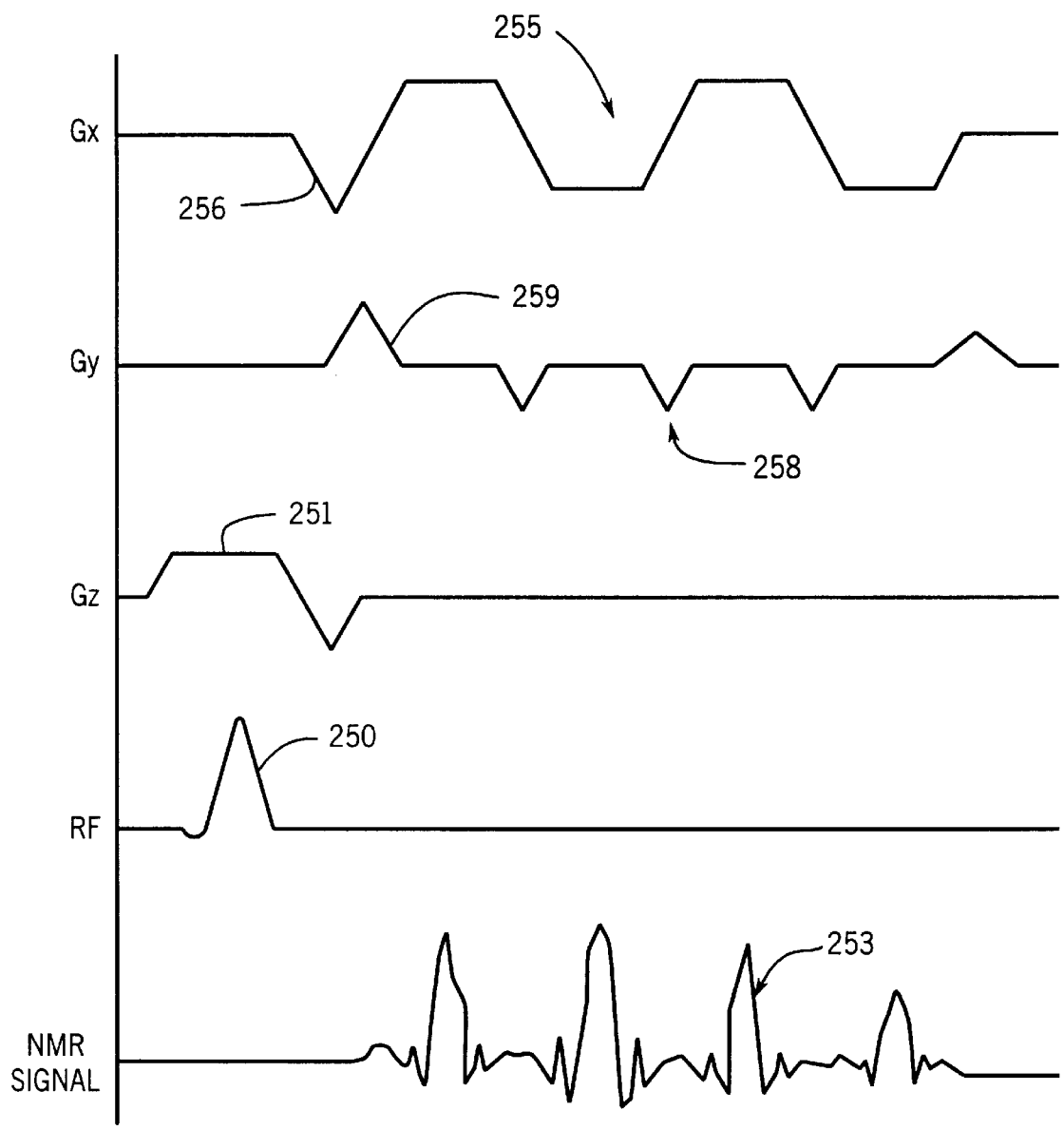

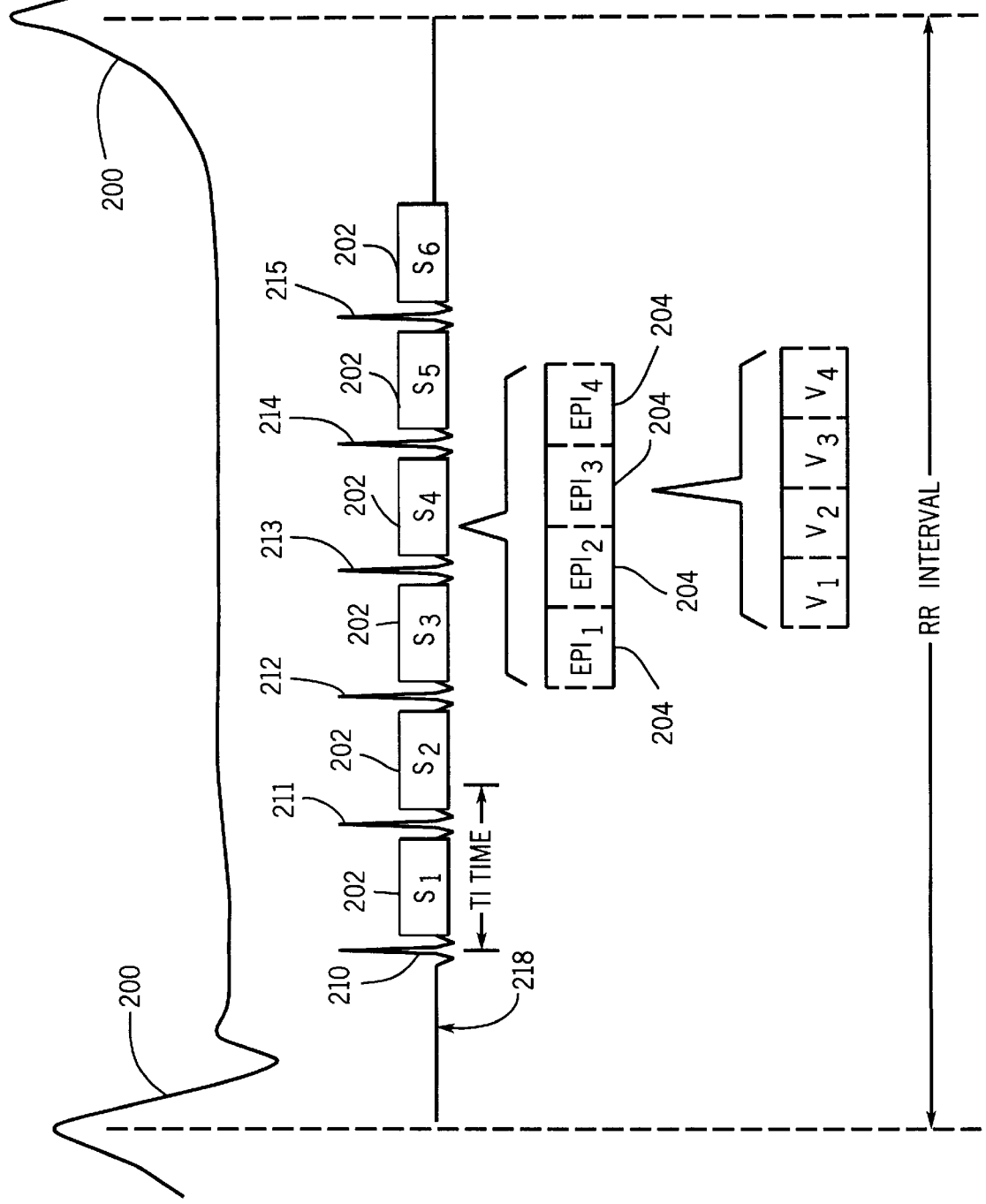

ACQUISTION OF SEGMENTED CARDIAC GATED MRI PERFUSION IMAGES

BACKGROUND OF THE INVENTION

The field of the invention is nuclear magnetic resonance imaging methods and systems. More particularly, the invention relates to the production of perfusion images in a fast cardiac gated MRI acquisition.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Most NMR scans currently used to produce medical images require many minutes to acquire the necessary data. The reduction of this scan time is an important consideration, since reduced scan time increases patient throughput, improves patient comfort, improves image quality by reducing motion artifacts, and enables the performance of medical test procedures such as timed pharmacological stress tests (e.g. multi-stage dobutamine stress test). There is a class of pulse sequences which have a very short repetition time (TR) and result in complete scans which can be conducted in seconds rather than minutes. When applied to cardiac imaging, for example, a complete scan from which a series of images showing the heart at different phases of its cycle or at different slice locations can be acquired in a single breath-hold.

Faster scan times can be achieved by segmenting k-space and acquiring multiple phase encoding k-space views per cardiac cycle. The scan time is speeded up by a factor equal to that of the number of k-space views acquired per image per R-R interval. In this manner, a typical CINE acquisition with a matrix size of 128 pixels in the phase encoding direction can be completed in as little as 16 heart beats, when 8 k-space views per segment are acquired.

Multiple slice locations can be visualized by repeated acquisition of the same k-space segment within each R—R interval, but by exciting different slice locations each at a different phase of the cardiac cycle. The number (n) of slice locations ($S_1$–$S_n$) during a cardiac cycle is determined by the time needed to acquire data for a single segment and the length of the cardiac R—R interval:

$$N = R\text{—}R \text{ time}/vps \times TR$$

where vps is the number of k-space views per segment, and TR is the pulse sequence repetition time. The total scan time is then $$\text{Scan time} = \frac{yres}{vps} \times R - R\ time$$

where yres is the total number of phase encoding views in the image. Typically, an image utilizes 128 or more phase encoding views, and 8 views per segment is also often used.

In segmented k-space scans, the total scan time can be substantially reduced by increasing the number of views per segment (vps). However, as indicated by the above, this is at the expense of reducing the number of slice locations that can be acquired during each cardiac cycle.

Imaging of blood perfusion in tissue is closely related to the imaging of blood flow in vascular structures. Angiography, or the imaging of vascular structures, is very useful in diagnostic and therapeutic medical procedures. As with MR angiography, MR perfusion imaging is typically performed by injecting a bolus of an MR active contrast agent into the patient during an imaging session. These agents can either decrease the T1 of blood to enhance the detected MR signal (e.g. Gd-DTPA), or they can decrease the T2 of blood to attenuate the detected MR signal (e.g. iron oxide particles). As the bolus passes through the body, the enhanced (or attenuated) signal created by the bolus increases (or decreases) the signal intensity observed in perfused tissue, but not in non-perfused tissue. The degree of signal change in the observed tissue can be used to determine the degree of tissue perfusion.

Since perfusion measurements are based on the strength of the NMR signals acquired during the scan, it is very important that the NMR signal strength be made insensitive to other measurement variables. One such variable is the magnitude of the longitudinal magnetization $M_z$ which is tipped into the transverse plane by the rf excitation pulse in the NMR pulse sequence. After each such excitation, the longitudinal magnetization is reduced and then it recovers magnitude at a rate determined by the $T_1$ constant of the particular spins being imaged. If another pulse sequence is performed before the longitudinal magnetization has recovered, the magnitude of the acquired NMR signal will be less than the signal produced by a pulse sequence which is delayed long enough to allow full recovery of the longitudinal magnetization. It is important in perfusion imaging that this variable (i.e. longitudinal magnetization) be maintained at a constant level throughout the scan.

When cardiac gating is used to control the acquisition of NMR perfusion image data, the time interval between acquisitions can vary considerably with a consequent variation in the longitudinal magnetization. This is particularly true if the subject has an irregular heart beat (i.e. arrhythmia). One solution to this problem is to apply an rf saturation pulse to the subject just prior to each pulse sequence, or pulse sequence segment (for each slice) and allow a fixed recovery time (TI) to occur before performing the pulse sequence. Unfortunately, unless the recovery time TI is fairly lengthy, the resulting NMR signals will be very small with a consequent reduction in the acquired NMR signals and the picture SNR. On the other hand, lengthening the recovery period TI lengthens the time ($T_{seg}$) required to perform each pulse sequence segment $$T_{seg} = TI + vps \times TR,$$

and reduces the number of slice locations that can be acquired during a cardiac R—R interval. In other words, there is a direct trade-off between image quality and the number of locations that can be acquired in a single breath-hold scan.

SUMMARY OF THE INVENTION

The present invention is a method and system for acquiring data for NMR images in which the longitudinal magnetization is preconditioned with a selective rf saturation pulse prior to the acquisition of NMR data. More particularly, the method includes acquiring NMR data from a plurality of slice locations $S_1$–$S_n$, interleaving selective rf saturation pulses with the NMR data acquisition sequences such that each rf saturation pulse saturates spins in a slice location that is acquired a time interval TI after the rf saturation pulse is applied, and NMR data is acquired from another slice location during the time interval TI.

A general object of the invention is to increase the image SNR without reducing the number of slice locations that can be acquired in a given scan time. The time interval TI between the conditioning rf saturation pulse and its slice location is increased to allow longitudinal magnetization to further recover and to thereby increase the magnitude of the acquired NMR signals. This results in an increase in image SNR. The number of slice locations acquired during the scan is maintained by acquiring NMR data from another slice location during the time interval TI during which the longitudinal magnetization is recovering.

BRIEF DESCRIPTION OF THE DRAWINGS

FIG. 2 is a graphic representation of the EPI pulse sequence used in the preferred embodiment of the invention; and FIG. 3 is a graphic illustration of the acquisition of MR data during a cardiac cycle using the EPI pulse sequence of FIG. 2 interleaved with rf saturation pulses according to the present invention.

DESCRIPTION OF THE PREFERRED EMBODIMENT

Figure 1:
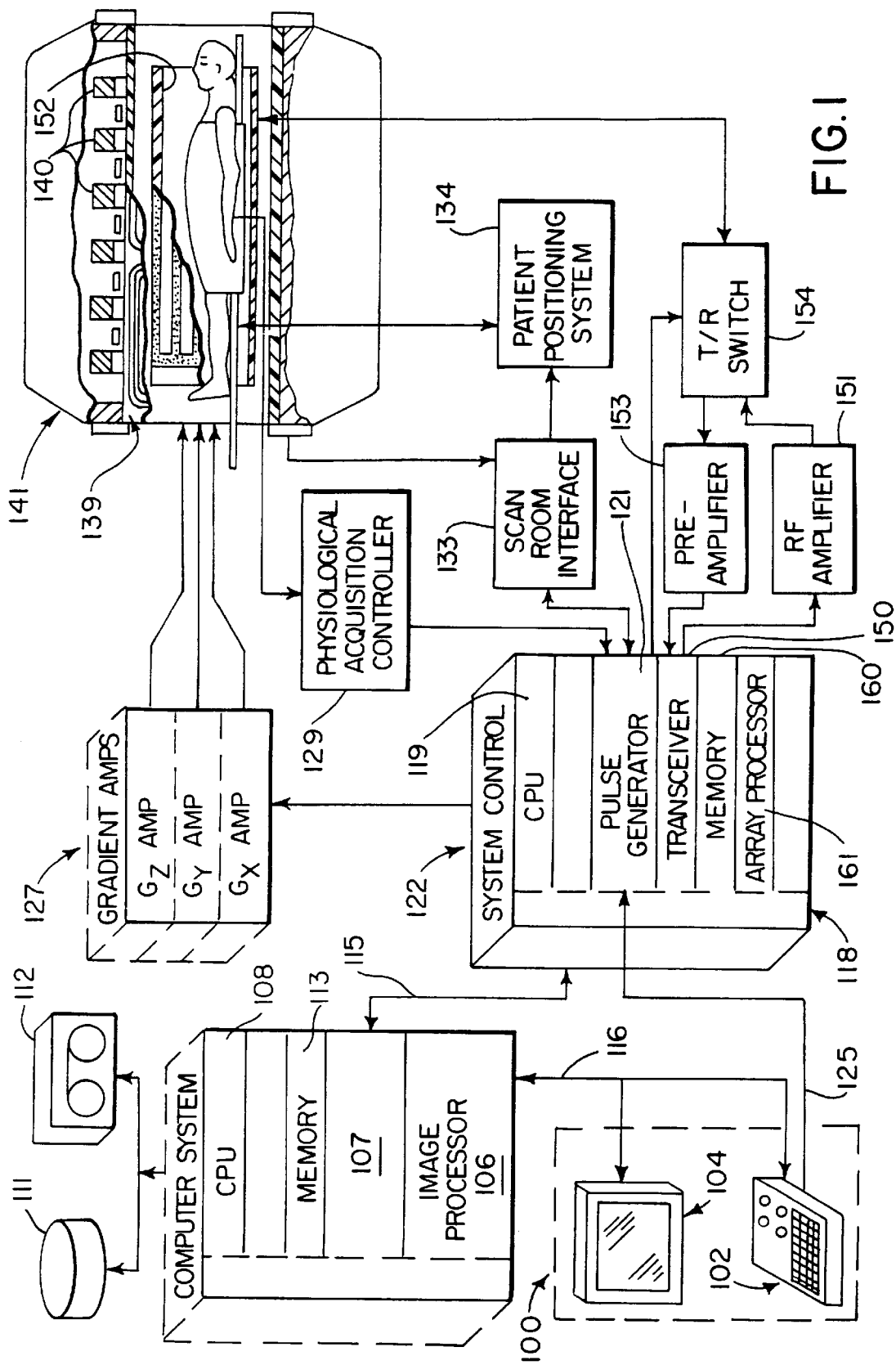
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes attached to the patient. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a surface coil) to be used in either the transmit or receive mode.

The NMR signals picked up by the RF coil 152 are digitized by the transceiver module 150 and transferred to a memory module 160 in the system control 122. When the scan is completed and an array of raw k-space data has been acquired in the memory module 160. As will be described in more detail below, this raw k-space data is rearranged into separate k-space data arrays for each image to be reconstructed, and each of these is input to an array processor 161 which operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104. For a more detailed description of the transceiver 150, reference is made to U.S. Pat. Nos. 4,952,877 and 4,992,736 which are incorporated herein by reference.

The EPI pulse sequence employed in the preferred embodiment of the invention is illustrated in FIG. 2. A 10° RF excitation pulse 250 is applied in the presence of a slice select gradient pulse 251 to produce transverse magnetization in a slice. A total of four separate NMR echo signals, indicated at 253 are acquired during the EPI pulse sequence. Each NMR echo signal 253 is individually phase encoded to sample a line of k-space in an interleaved manner described in more detail below. While only four NMR echo signals 253 are acquired in the preferred embodiment, up to sixteen NMR echo signals 253 may be acquired in some applications.

The NMR echo signals 253 are gradient recalled echoes produced by the application of an oscillating readout gradient 255. The readout sequence is started with a pre-phasing readout gradient lobe 256 and the echo signals 253 are produced as the readout gradient oscillates between positive and negative values. A total of $N_x$ (e.g., $N_x$=128 to 256) samples are taken of each NMR echo signal 253 during each readout gradient pulse 255. The four successive NMR echo signals 253 are separately phase encoded by a series of phase encoding gradient pulses 258. A pre-phasing phase-encoding lobe 259 occurs before the echo signals are acquired to position the first view at the desired location in k-space. Subsequent phase encoding pulses 258 occur as the readout gradient pulses 255 switch polarity, and they step the phase encoding upward through $k_y$-space. The phase encode steps may be in any order such that discontinuities in $k_y$-space sampling are minimized for improved image quality. To acquire a complete image, this pulse sequence is repeated thirty-two times (i.e. 128/4) and the pre-phasing lobe 259 is changed each time to sample a different part of k-space. Note that the pulse sequence may also be interleaved or distributed across several cardiac intervals. With a pulse repetition rate (TR) of 10 msecs., a complete image can be acquired in about 320 milliseconds.

Because the heart is beating, its shape changes substantially over a 320 ms time interval. Therefore, an ECG-gated, segmented k-space data acquisition is performed. In addition, data is acquired throughout much of the cardiac cycle so that images at different locations may be reconstructed. This acquisition is illustrated in FIG. 3 for a single heart beat.

Referring particularly to FIG. 3, a segment 202 of k-space is repeatedly acquired during the R—R interval between cardiac trigger signals 200. The length of the R—R interval is a function of the patient's heart rate, and in the example shown, six repetitions of segment 202 are acquired throughout the cardiac cycle, commencing at a preset time interval after the ECG trigger signal 200. Each repetition of segment 202 is an identical sampling of a portion of k-space from successive slice locations $S_1$–$S_6$.

In the preferred embodiment, each segment is comprised of four echo planar image shots 204 ($EPI_1$ through $EPI_4$). As described above with reference to FIG. 2, each EPI shot ($EPI_1$ through $EPI_4$) acquires four NMR signals 253 at four different phase encodings to sample four different views ($V_1$ through $V_4$) of k-space. The four views are different in each EPI shot 204 such that a total of 16 different views are acquired during each segment 202.

The acquisition continues for eight successive cardiac cycles. After each cardiac cycle the particular views acquired by each segment 202 are changed such that a total of 128 different views are acquired after eight heart beats. A 128 by 128 pixel image can then be reconstructed from each NMR k-space data set to depict the subject at six different slice locations $S_1$–$S_6$.

It should be apparent that the particular pulse sequence used to acquire the NMR data from each slice location is not limited to the EPI pulse sequence and that other fast pulse sequences such as small flip-angle gradient recalled echo pulse sequences and fast spin echo pulse sequences may also be used. Also, the number of segments 202 acquired during the R—R interval and the number of views acquired during each segment 202 can be varied depending on the particular circumstances of the scan.

Referring still to FIG. 3, interleaved with the segments 202 are a corresponding set of selective rf saturation pulses 210–215. Each selective rf saturation pulse 210–215 is shaped and has a frequency content such that it excites spins in a subsequent slice location. As is well known in the art, a magnetic field gradient is applied concurrently with each rf saturation pulse 210–215 and cooperates therewith to locate the excitation in the proper slice.

An important aspect of the present invention is that each selective rf saturation pulse 210–215 excites spins in a subsequently acquired slice location, but not the following acquired slice location. For example, the rf saturation pulse 210 saturates spins located in slice location $S_2$, not slice location $S_1$ which is acquired immediately thereafter. As a result, the recovery time for the spins in slice $S_2$ is a period TI which includes the time required to acquire data from the first slice location $S_1$ plus the time required to produce the next selective rf saturation pulse 211. The same applies to subsequent selective rf saturation pulses 211–214 and their corresponding excited slice locations $S_3$–$S_6$.

The use of interleaved selective rf saturation pulses conditions the spins in the slice locations $S_2$–$S_6$ to have the same longitudinal magnetization. In the preferred embodiment the flip angle of each selective rf saturation pulse is 90°. This insures that the longitudinal magnetization is completely suppressed and that variations in the R—R interval due to cardiac arrhythmias will not corrupt the perfusion images.

Because the selective rf saturation pulses occur at a reasonably long, but constant time interval TI prior to the acquisition of NMR data from the saturated slice locations, the longitudinal magnetization recovers in magnitude a substantial amount. This enables a much larger NMR signal to be acquired and this in turn results in higher SNR images. In the preferred embodiment, for example, where each acquisition segment 202 requires from 80 to 130 milliseconds to perform, the NMR signal strength is more than doubled in tissues with a $T_1$ of 200 milliseconds and a $T_2$ of 50 milliseconds. This is compared with a scan in which non-selective rf saturation pulses are applied just prior to each acquisition segment 202.

It should be apparent that because the longitudinal magnetization in the first slice location is unaffected by the first selective rf saturation pulse 210, it must be considered differently. One approach is to simply treat the first acquisition segment 202 in the series as a conditioning sequence for the second acquisition segment 202 and throw away the acquired data. The preferred approach, however, is to add a preparatory pulse sequence just prior to the first selective rf saturation pulse 210 as indicated at 218. This preparatory pulse sequence is comprised of a selective rf saturation pulse having a flip angle from 60° to 75°, followed by one or two "dummy" excitations using the pulse sequence of FIG. 3. Both the saturation pulse and the dummy excitations select the first slice location $S_1$ and they drive the spin magnetization into a steady state that approximates that produced in subsequent slice locations $S_2$–$S_6$ in the series. Thus, while the TI for the first slice location $S_1$ may only be from 10 to 30 milliseconds, as compared to a TI of from 80 to 130 milliseconds for subsequent slice locations $S_2$–$S_6$, the longitudinal magnetization is conditioned to be substantially the same magnitude by reducing the flip angle of the selective rf saturation pulse for the first slice location $S_1$.

What is claimed is:

1. A method for acquiring NMR data with an MR system from a plurality of slice locations in a subject, the steps comprising:

a) acquiring NMR data from each of the slice locations by performing a series of corresponding data acquisition segments; and b) interleaving selective rf saturation pulses with the series of data acquisition segments, such that each selective rf saturation pulse is followed by a data acquisition segment, and wherein each selective rf saturation pulse is selective to excite spins in a slice location from which NMR data is acquired during a data acquisition segment that is performed after the following data acquisition.

2. The method as recited in claim 1 in which the series of data acquisition segments occur during a cardiac cycle of the subject and steps a) and b) are repeated over a plurality of cardiac cycles.

3. The method as recited in claim 1 in which the acquired NMR data is imaging data and each data acquisition segment includes:

performing an imaging NMR pulse sequence with the MR system.

4. The method as recited in claim 3 in which the imaging NMR pulse sequence is performed a plurality of times during each data acquisition segment to acquire a corresponding plurality of views.

5. The method as recited in claim 3 which includes reconstructing an image for each slice location from the NMR data acquired during each corresponding data acquisition segment.

6. The method as recited in claim 5 in which the reconstructed images indicate blood perfusion in the subject.

7. An MR system for acquiring NMR data from a plurality of slice locations in a subject, the combination comprising:

a polarizing magnetic field for producing a polarizing magnet in the subject;

an rf coil for producing an excitation field in the subject and for receiving an NMR signal;

a set of gradient coils for producing a magnetic field gradient in the subject;

a transceiver coupled to the rf coil for energizing the rf coil and coupled to the rf coil to receive the NMR signal during a data acquisition period; and a pulse generator coupled to the set of gradient coils and the transceiver and being operable to:

a) perform a series of data acquisition segments which acquire NMR data from each of the respective slice locations in the subject;

b) produce a series of selective rf saturation pulses which are interleaved with the series of data acquisition segments such that each selective rf saturation pulse is followed by a data acquisition segment; and wherein each selective rf saturation pulse is selective to excite spins in a slice location from which NMR data is acquired during a data acquisition segment that is performed after the following data acquisition segment.

8. The MR system as recited in claim 7 which includes a physical acquisition controller that produces cardiac trigger signals for the pulse generator and the pulse generator is operable to repeat the series of data acquisition segments and interleaved series of selective rf saturation pulses after each cardiac trigger signal.

9. The MR system as recited in claim 8 in which each data acquisition segment includes a plurality of magnetic field gradient pulses which are changed in value after each cardiac trigger signal.

10. The MR system as recited in claim 7 in which each data acquisition segment includes an imaging NMR pulse sequence, and the series of data acquisition segments and interleaved series of rf saturation pulses are repeated until sufficient NMR image data is acquired to reconstruct an image at each slice location.

11. The MR system as recited in claim 7 which includes means for signaling to the pulse generator the start of the subject's cardiac cycle, and the series of data acquisition segments are repeated at substantially the same time during each of a succession of cardiac cycles.

* * * * *